(12) United States Patent
Lee

(10) Patent No.: US 9,545,038 B2
(45) Date of Patent: Jan. 10, 2017

(54) INVERTER HOUSING

(71) Applicant: MANDO CORPORATION, Pyeongtaek-si, Gyeonggi-do (KR)

(72) Inventor: Seok Hwan Lee, Seoul (KR)

(73) Assignee: MANDO CORPORATION, Pyeongtaek-si (KR)

( * ) Notice: Subject to any disclaimer, the term of this patent is extended or adjusted under 35 U.S.C. 154(b) by 0 days.

(21) Appl. No.: 14/742,225

(22) Filed: Jun. 17, 2015

(65) Prior Publication Data

US 2015/0373870 A1    Dec. 24, 2015

(30) Foreign Application Priority Data

Jun. 23, 2014    (KR) .......................... 10-2014-0076350

(51) Int. Cl.
*H05K 7/20*    (2006.01)
*H05K 7/14*    (2006.01)

(52) U.S. Cl.
CPC ........ *H05K 7/20918* (2013.01); *H05K 7/1432* (2013.01)

(58) Field of Classification Search
CPC .... H05K 7/20; H05K 7/20918; H05K 7/1432; H05K 7/2089
USPC ....... 361/709, 704, 141, 632, 763, 760, 781, 361/782; 165/185
See application file for complete search history.

(56) References Cited

U.S. PATENT DOCUMENTS

2004/0095730 A1* 5/2004 Youm ................. H01L 23/4006
361/718

2007/0109715 A1* 5/2007 Azuma .................... B60K 6/28
361/299.3
2012/0020025 A1* 1/2012 Sotome .................... H01G 2/08
361/704
2012/0140539 A1* 6/2012 Chinthavali ....... H05K 7/20918
363/141
2013/0271941 A1    10/2013 Guan et al.

FOREIGN PATENT DOCUMENTS

DE    102010019717 A1    11/2011
KR    1020120136162 A    12/2012

OTHER PUBLICATIONS

German Office Action issued on Oct. 26, 2015 in connection with the counterpart German Patent Application No. 102015211202.0.

* cited by examiner

*Primary Examiner* — Dion R Ferguson
*Assistant Examiner* — Mandeep S Buttar
(74) *Attorney, Agent, or Firm* — Hauptman Ham, LLP

(57) ABSTRACT

Disclosed is an inverter housing which is installed in a vehicle, and more particularly, an inverter housing which is capable of having a high heat dissipation effect and realizing a compact size. To this end, the inverter housing according to the present invention includes a body having a plate shape; a plurality of capacitor insertion portions formed to be recessed in a first direction of the body, so that capacitors are inserted thereinto, and integrally arranged to be spaced from each other; a plurality of switching device installation portions configured as spaces in which switching devices are installed, and arranged between the capacitor insertion portions in a second direction of the body opposite to the first direction; and a plurality of heat dissipation fins installed in the first direction of the body to face the switching devices with the body interposed therebetween.

6 Claims, 10 Drawing Sheets

INVERTER HOUSING

CROSS-REFERENCE TO RELATED APPLICATION

This application claims priority to and the benefit of Korean Patent Application No. 10-2014-0076350, filed on Jun. 23, 2014 the disclosure of which is incorporated herein by reference in its entirety.

BACKGROUND

1. Field of the Invention

The present invention relates to an inverter housing in which various switching devices for converting an alternating current (AC) into a direct current (DC) or converting the DC into the AC, and capacitors are installed, and more particularly, to an inverter housing capable of having high heat dissipation efficiency and realizing a compact size.

2. Discussion of Related Art

An inverter which is a power inverter installed in a vehicle is connected between a motor and a battery, and serves to convert an AC into a DC or to convert the DC into the AC.

FIGS. 1 and 2 are a plan view and a cross-sectional view schematically illustrating an arrangement structure of a switching device and a capacitor in a conventional inverter housing. And FIG. 3 is a plan view schematically illustrating a state in which a plurality of switching devices and capacitors are arranged in the conventional inverter housing.

As illustrated in FIGS. 1 to 3, various electronic components such as a switching device 20 including a field effect transistor (FET) and an insulated gate bipolar transistor (IGBT), and a capacitor 30 are built in the conventional inverter 10.

However, among the various electronic components built in the inverter 10, the switching device 20 and the capacitor 30 releases excessive heat.

Also, since various heat generation devices such as the switching device 20 and the capacitor 30 are concentrated in a certain area of the inverter 10, there is a problem in that heat is not evenly spread over an entire area, but accumulated in the certain area, and thus an internal temperature of the inverter is increased locally.

When the internal temperature is excessively increased by the various heat generation devices in the inverter 10, many problems may occur in a normal operation of the inverter 10, and thus a life span of the inverter 10 may be reduced.

Furthermore, in the conventional inverter 10, since various built-in devices such as the switching device 20 and the capacitor 30 are concentrated in one place, there is inefficiency in the spatial arrangement of the devices, and an entire volume of the inverter 10 is increased, and thus there is much difficulty in realizing a compact size of the inverter 10.

Also, in the case of the conventional inverter 10, since a separate ground terminal 64, in addition to a terminal 62, should be provided at an outside of the inverter housing 12, there are some problems in that waterproofing performance is degraded, and a size thereof is increased.

Therefore, to minimize an increase in the temperature due to the heat generated from the inside of the inverter, and also to optimize performance, it is required to manufacture an inverter housing having optimal heat dissipation efficiency.

SUMMARY OF THE INVENTION

The present invention is directed to an inverter housing structure in which a plurality of switching devices are arranged at regular intervals in an inverter housing having a predetermined shape, and a capacitor is distributively arranged at a space between the switching devices, and thus excellent heat dissipation efficiency and a compact size can be provided.

Also, the present invention is directed to an inverter housing structure in which an inverter housing is electrically grounded, and a separate ground terminal is not needed to be provided at an outside of the inverter housing, and thus a compact design having a reduced entire size can be provided.

According to an aspect of the present invention, there is provided an inverter housing including a body having a plate shape; a plurality of capacitor insertion portions formed to be recessed in a first direction of the body, so that capacitors are inserted thereinto, and integrally arranged to be spaced from each other; a plurality of switching device installation portions configured as spaces in which switching devices are installed, and arranged between the capacitor insertion portions in a second direction of the body opposite to the first direction; and a plurality of heat dissipation fins installed in the first direction of the body to face the switching devices with the body interposed therebetween.

The body may have a circular plate shape, and the capacitor insertion portions and the switching device installation portions may be alternately arranged in a circular shape along an inner edge of the circular plate-shaped body.

The inverter housing may further include a fan configured to supply a flow toward a center of the body in which the capacitor insertion portions and the heat dissipation fins are installed.

The heat dissipation fins may be radially arranged.

The inverter housing may further include a fan guide formed so that the center of the body on which the heat dissipation fins are installed protrudes.

The body including the capacitor insertion portions and the heat dissipation fins may be grounded.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF MAIN ELEMENTS

| | |
|---|---|
| 100: inverter housing | 110: body |
| 120: capacitor | 130: capacitor insertion portion |
| 140: switching device | 150: switching device installation portion |
| 160: heat dissipation fin | 170: fan |
| 180: fan guide | |

DETAILED DESCRIPTION OF EXEMPLARY EMBODIMENTS

Exemplary embodiments of the present invention will be described in detail below with reference to the accompanying drawings.

Figure 1:
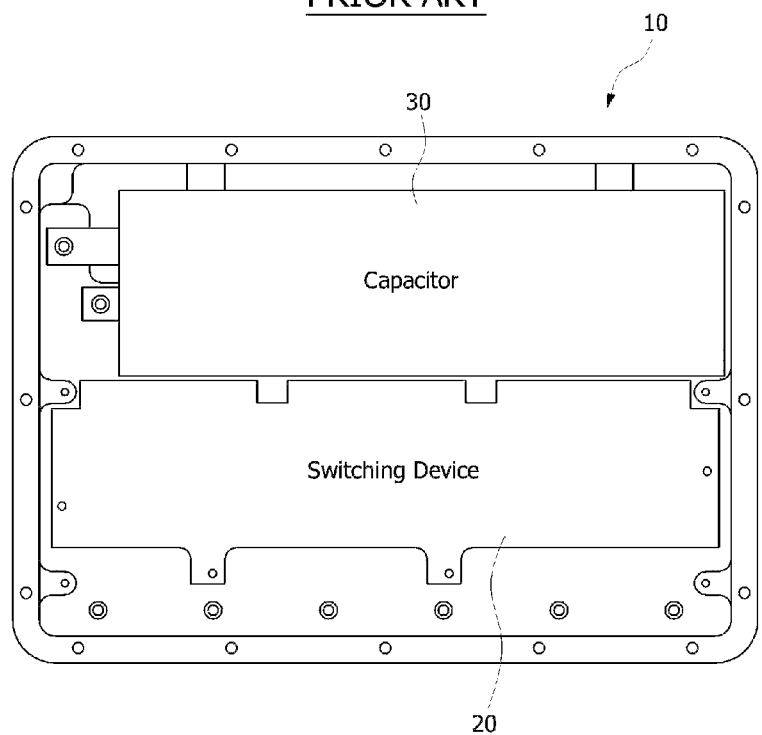
FIG. 1 is a plan view schematically illustrating an arrangement structure of a switching device and a capacitor in a conventional inverter housing.
Figure 2:
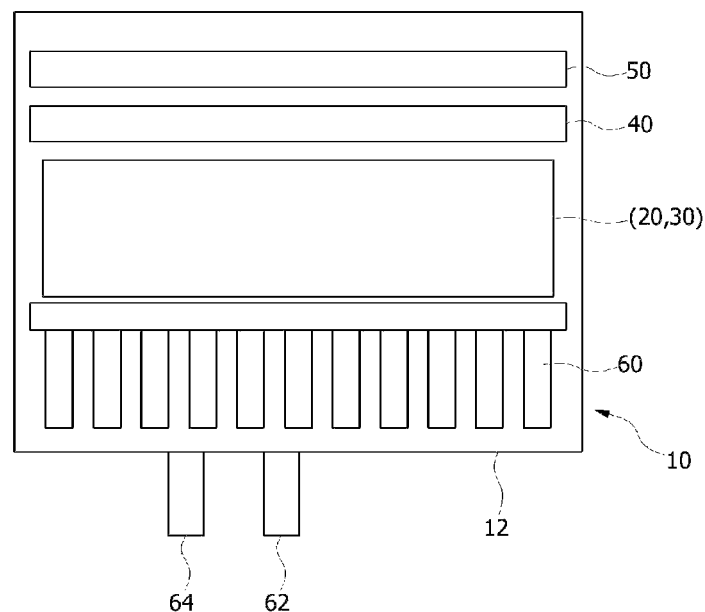
FIG. 2 is a cross-sectional view schematically illustrating the arrangement structure of the switching device and the capacitor in the conventional inverter housing.
Figure 3:
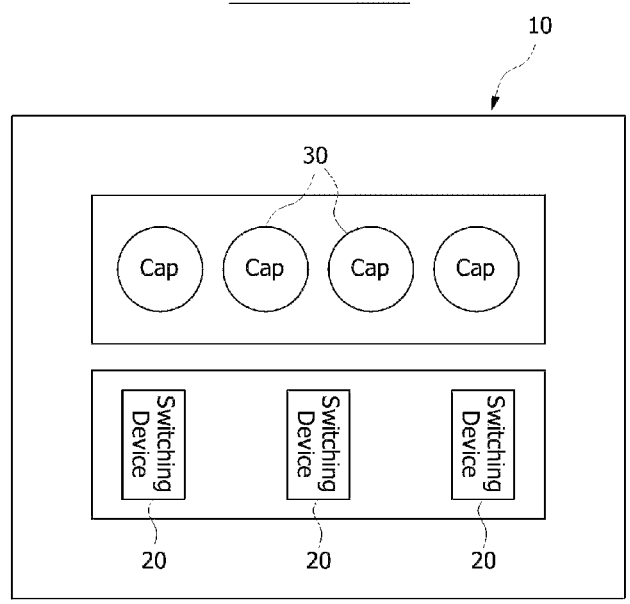
FIG. 3 is a plan view schematically illustrating a state in which a plurality of switching devices and capacitors are installed in the conventional inverter housing.
Figure 4:
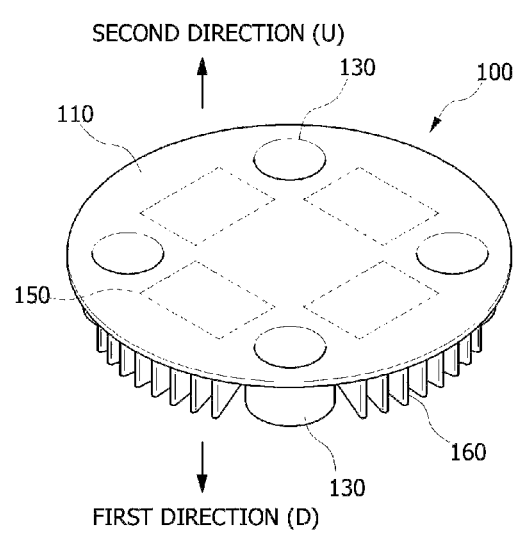
FIG. 4 is a perspective view illustrating a structure of an inverter housing according to one embodiment of the present invention.
Figure 5:
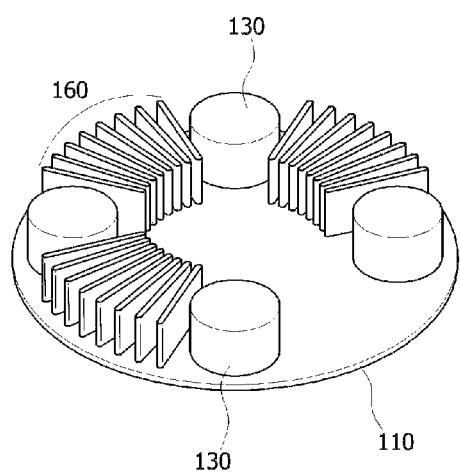
FIG. 5 is a back perspective view illustrating a structure of a back surface of the inverter housing illustrated in FIG. 4.
Figure 6:
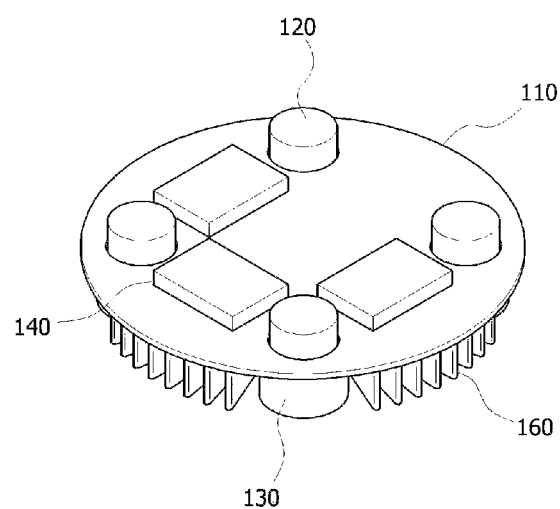
FIG. 6 is a view illustrating a use state in which a switching device and a capacitor are installed at the inverter housing illustrated in FIG. 4.
Figure 7:
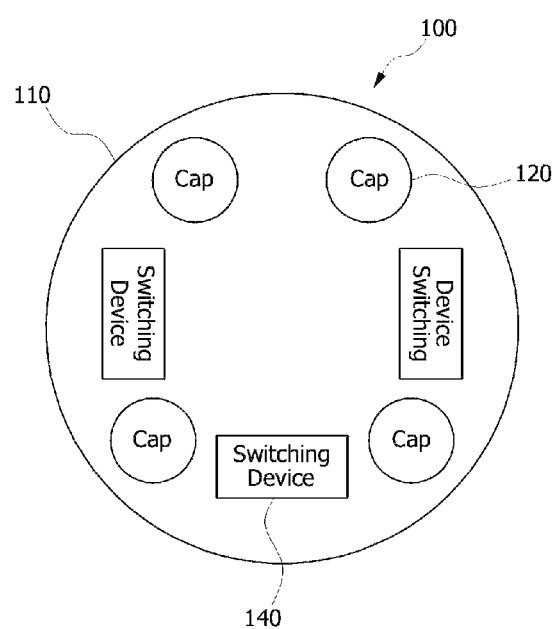
FIG. 7 is a conceptual view schematically illustrating a state in which a plurality of switching devices and capacitors are dispersively arranged in the inverter housing according to the present invention.

FIG. 4 is a perspective view illustrating a structure of an inverter housing according to one embodiment of the present invention, FIG. 5 is a back perspective view illustrating a structure of a back surface of the inverter housing illustrated in FIG. 4. And FIG. 6 is a view illustrating a use state in which a switching device and a capacitor are installed at the inverter housing illustrated in FIG. 4, and FIG. 7 is a conceptual view schematically illustrating a state in which a plurality of switching devices and capacitors are dispersively arranged in the inverter housing according to the present invention.

Referring to FIGS. 4 to 7, the inverter housing 100 according to the present invention includes a body 110 having a plate shape, insertion portions 130 which are arranged at one side of the body 110 to be spaced at regular intervals, so that capacitors 120 can be inserted thereinto, switching device installation portions 150 which are spaces of the body 110 arranged between the insertion portions 130, so that switching devices 140 can be installed thereon, and a plurality of heat dissipation fins 160 which are installed so as to face the switching devices 140 with the body 110 interposed therebetween.

The body 110 is formed in a circular plate, and a plurality of capacitor insertion portions 130 into which the capacitors 120 are to be inserted are formed at an inside of body 110 to be spaced at regular intervals and to be arranged in a circular shape.

Each of the capacitor insertion portions 130 is formed in a cylindrical shape of which an upper surface is open and a lower surface is closed, so that the capacitor 120 can be inserted thereinto, and which is integrally formed to be recessed at a predetermined width in a first direction (a lower direction) of the body 110.

Therefore, the capacitors 120 are isolated from the switching devices 140 by outer walls of the capacitor insertion portions 130, while inserted into the capacitor insertion portions 130.

When the capacitors 120 installed in the capacitor insertion portions 130 generate heat, the heat is dissipated by the capacitor insertion portions 130 surrounding the capacitors 120, and a temperature is prevented from being excessively increased.

The switching device installation portions 150 are installation spaces on which the switching devices 140 are directly installed, and which are arranged in a second direction (an upper direction) of the body 110 opposite to the first direction (the lower direction) of the body 110.

At this time, the switching device installation portions 150 are arranged between the adjacent capacitor insertion portions 130 so that the capacitor insertion portions 130 and the switching device installation portions 150 are alternately arranged along an inner edge of the circular-shaped body 110.

Since switching devices 140 generate more heat than the capacitors 120, the plurality of heat dissipation fins 160 are installed to face the switching devices 140 with the circular-shaped body 110 interposed therebetween in the first direction D of the body 110.

That is, a plurality of the heat dissipation fins 160 are installed so as to form a group on the body 110 located at an opposite side to each of the switching device installation portions 150, thereby, enabling a heat dissipation function to be performed when the switching devices 140 generate heat.

As described above, the plurality of capacity insertion portions 130 which are spaced at the regular intervals and into which the capacitors 120 are inserted into the circular-shaped body 110 are arranged. Also, each of the switching devices 140 is arranged at a space between the capacitor insertion portions 130, and the plurality of heat dissipation fins 160 are installed at the opposite sides of the body 110 on which the switching devices 140 are mounted, and the switching devices 140 and the capacitors 120 are uniformly distributed and arranged so as to be spaced from each other, and thus the heat dissipation function is performed by the heat dissipation fins 160 and wall surfaces of the capacitor insertion portions 130 which are uniformly distributed, and a heat dissipation effect in the inverter may be considerably increased.

Further, since the various heat generation devices, such as the switching device 140 and the capacitor 120, which generate a relatively large amount of heat values are uniformly distributed in the form of a circle on the circular-shaped body 110. A whole size of the inverter may be remarkably reduced, compared with a conventional rectangular inverter structure, and thus the inverter may have a compact size.

Furthermore, the body 110, the capacitor insertion portions 130 and the heat dissipation fins 160 should be electrically grounded.

In other words, in the conventional converter structure, a separate ground terminal is provided at an outside of the inverter housing. However, since the inverter housing according to the present invention is grounded, the separate ground terminal is not needed to be provided at the outside of the inverter housing 100.

Therefore, the overall size of the inverter may be reduced, and thus the inverter may be compactly designed. In addition, an existing problem in which the waterproofing performance is degraded due to the ground terminal installed at the outside of the inverter housing may be fundamentally solved.

Figure 8:
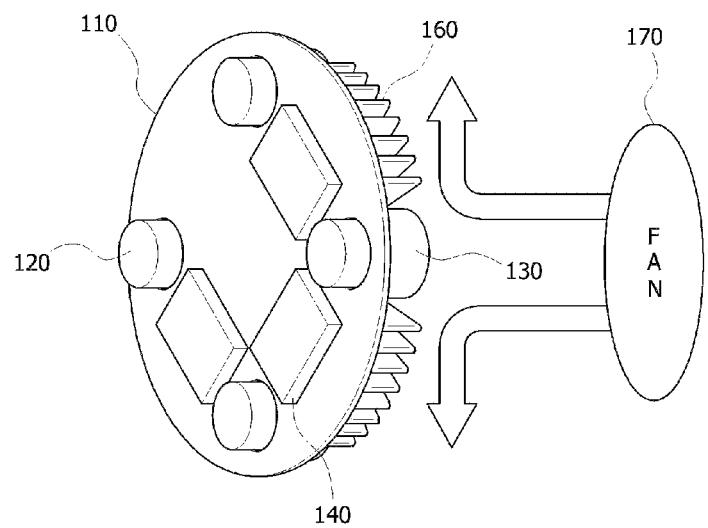
FIG. 8 is a conceptual view illustrating a state in which a fan is installed at a portion spaced from a center of the inverter housing to generate a forced flow according to another embodiment of the present invention.

Meanwhile, FIG. 8 is a conceptual view illustrating a state in which a fan is installed at a portion spaced from a center of the inverter housing to generate a forced flow according to another embodiment of the present invention. And FIG. 9 is a conceptual view illustrating a process in which a flow radially spreads from the center C of the inverter housing, when the forced flow is generated by the fan, and thus heat dissipation occurs.

Figure 9:
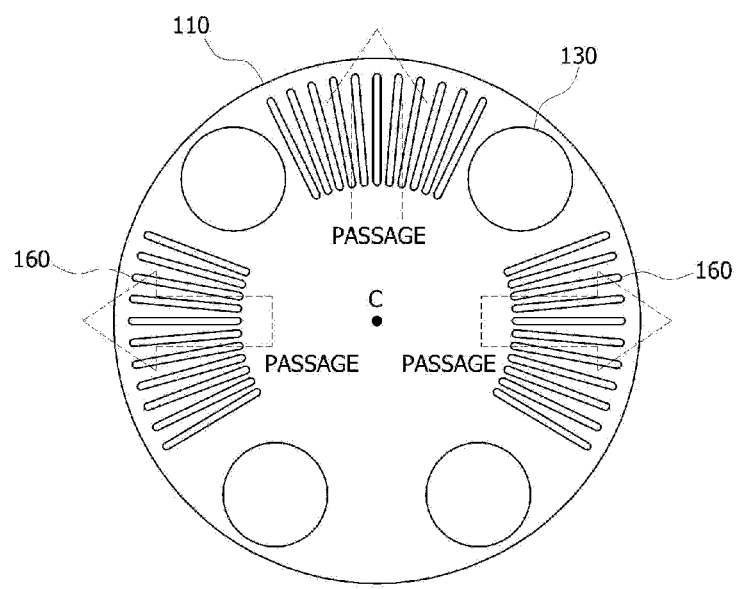
FIG. 9 is a conceptual view illustrating a process in which a flow radially spreads from the center of the inverter housing, when the forced flow is generated by the fan, and thus heat dissipation occurs.

Referring to FIGS. 8 and 9, in the inverter housing 100 according to the present invention, a fan 170 is additionally installed in the first direction D of the body 110 so that the forced flow is generated toward the body 110 in which the switching devices 140 and the capacitors 120 are disposed, and thus the heat dissipation effect may be further increased.

The fan 170 is disposed at a space in the first direction D spaced a predetermined distance from the body 110, and thus the flow is supplied to the center C of the body 110 in which the capacitor insertion portions 130 and the heat dissipation fins 160 are installed.

The forced flow generated by the fan 170 collides with the center C of the body 110 of the inverter housing 100, and radially moves along the body 110, and then performs a heat transfer operation with the capacitor insertion portions 130 and the heat dissipation fins 160 through the flow.

At this time, since the heat dissipation fins 160 are radially arranged relative to the center C of the body 110, the heat dissipation may be more effectively performed according to a movement of the flow.

As described above, since the fan 170 is installed at the center C of the body 110 of the inverter housing 100 to supply the forced flow from the outside to the body 110, the heat dissipation effect may be further enhanced, and when an installation structure of the fan 170 is applied, it is very advantageous in manufacturing a motor integrated (a three-phase motor or the like) inverter.

Figure 10:
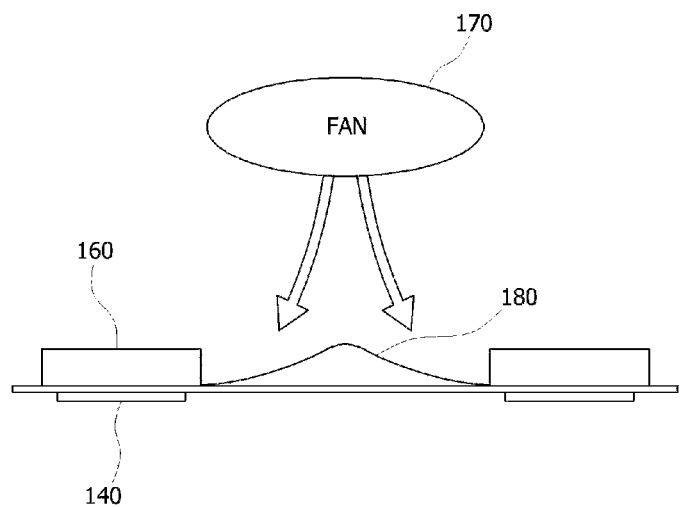
FIG. 10 is a conceptual view illustrating a fan guide formed at the center of the inverter housing so that the flow is guided to a heat dissipation fin, when the forced flow is generated by the fan of FIG. 8.

Also, as illustrated in FIG. 10, a fan guide 180 formed so that the center C of the body 110 of the inverter housing 100 convexly protrudes is installed, and thus the forced flow supplied from the fan 170 may be guided to the heat dissipation fins 160. A shape of the fan guide 180 may be variously formed according to a size of the body 100 and a size and a shape of each heat dissipation fin 160.

In addition, since the body 110 of the inverter housing 100 is electrically grounded, the separate ground terminal is not needed to be installed at the outside of the inverter housing, and thus a height of the inverter housing may be reduced, and a compact size thereof may be realized.

Also, since the separate ground terminal is not needed to be installed, and the height of the inverter housing is reduced, a manufacturing cost may be reduced, compared with the related art.

According to a structure of the inverter housing of the present invention, as described above, the plurality of switching devices are arranged in the inverter housing to be spaced at regular intervals, and the plurality of heat dissipation fins are installed at the surface of the inverter housing opposite to the surface on which the switching devices are arranged. And the isolated capacitor insertion portions into which the capacitors are inserted are integrally formed between the switching devices, and the capacitors are respectively inserted into the capacitor insertion portions so as to be isolated from the switching devices, and thus the heat dissipation effect can be remarkably increased due to the isolation and the distributed arrangement of the switching devices and the capacitors, and also the durability of the inverter can be enhanced. Since the various heat generation devices are uniformly distributed, the overall size of the inverter can be reduced, and the compact size thereof can be realized. Also, since the inverter housing is electrically grounded, the separate ground terminal is not needed to be provided at the outside of the inverter housing, and thus the overall size of the inverter can be reduced and can be compactly designed, and also the waterproofing performance problem due to forming the ground terminal can be solved.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. An inverter housing comprising: a body having a plate shape; a plurality of capacitor insertion portions formed to be recessed in a first direction of the body, so that capacitors are inserted there into, and also integrally arranged to be spaced from each other; a plurality of switching device installation portions configured as spaces in which switching devices are installed, and arranged between the capacitor insertion portions in a second direction of the body opposite to the first direction; and a plurality of heat dissipation fins installed in the first direction of the body to face the switching devices with the body interposed there betweenl wherein the heat dissipation fins are radially arranged on the body; wherein the body has a circular plate shape, and wherein the capacitors and the heat dissipation fins are alternately arranged in a circular shape along an inner edge of the circular plate-shaped body.

2. The inverter housing of claim 1, wherein the body has a circular plate shape, and the capacitor insertion portions and the switching device installation portions are alternately arranged in a circular shape along an inner edge of the circular plate-shaped body.

3. The inverter housing of claim 1, further comprising a fan configured to supply a flow toward a center of the body in which the capacitor insertion portions and the heat dissipation fins are installed.

4. The inverter housing of claim 1, wherein the body, the capacitor insertion portions and the heat dissipation fins are grounded.

5. The inverter housing of claim 3, further comprising a fan guide formed so that the center of the body on which the heat dissipation fins are installed protrudes.

6. The inverter housing of claim 1, wherein the heat dissipation fins comprise groups of heat dissipation fins, and wherein each of the groups of heat dissipation fins is disposed between two capacitors, on the body.

* * * * *